United States Patent
Lock

(10) Patent No.: US 9,869,706 B2
(45) Date of Patent: Jan. 16, 2018

(54) CAPACITIVE SENSOR ELECTRODE

(71) Applicant: Microchip Technology Incorporated, Chandler, AZ (US)

(72) Inventor: Patrick Mok Kar Lock, Tsing Yi (HK)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 577 days.

(21) Appl. No.: 13/831,373

(22) Filed: Mar. 14, 2013

(65) Prior Publication Data
US 2014/0266261 A1 Sep. 18, 2014

(51) Int. Cl.
*G01R 27/26* (2006.01)
*G06F 3/044* (2006.01)

(52) U.S. Cl.
CPC ......... *G01R 27/2605* (2013.01); *G06F 3/044* (2013.01)

(58) Field of Classification Search
CPC ............... H01L 31/022466; H01L 33/42
USPC ..... 345/156, 169, 173–174, 45, 67, 93, 103; 324/347, 515, 649–697
See application file for complete search history.

(56) References Cited

U.S. PATENT DOCUMENTS

| | | | | |
|---|---|---|---|---|
| 6,297,811 B1* | 10/2001 | Kent | ........ | G06F 3/044 178/18.01 |
| 2010/0044122 A1* | 2/2010 | Sleeman | ........ | G01D 5/2405 178/18.06 |
| 2010/0252335 A1* | 10/2010 | Orsley | ........ | G06F 3/044 178/18.03 |
| 2010/0302201 A1 | 12/2010 | Ritter et al. | ........ | 345/174 |
| 2010/0309164 A1 | 12/2010 | Yeh et al. | ........ | 345/174 |
| 2011/0018557 A1* | 1/2011 | Badaye | ........ | G06F 3/044 324/658 |
| 2011/0095990 A1* | 4/2011 | Philipp | ........ | G06F 3/044 345/173 |
| 2011/0096016 A1 | 4/2011 | Yilmaz | ........ | 345/174 |
| 2011/0148809 A1* | 6/2011 | Kanehira | ........ | G06F 3/044 345/174 |
| 2012/0256647 A1 | 10/2012 | Tao et al. | ........ | 324/686 |
| 2013/0050108 A1* | 2/2013 | Hong | ........ | G06F 3/044 345/173 |
| 2013/0154995 A1* | 6/2013 | Trend | ........ | G06F 3/044 345/174 |
| 2013/0207923 A1* | 8/2013 | Mohindra | ........ | G06F 3/044 345/174 |

OTHER PUBLICATIONS

International Search Report and Written Opinion, Application No. PCT/US2014/019802, 9 pages, dated Jun. 27, 2014.
Taiwan Office Action, Application No. 103108784, 9 pages, dated Jul. 20, 2017.
European Office Action, Application No. 14713294.8, 4 pages dated Feb. 20, 2017.

* cited by examiner

*Primary Examiner* — Patrick Assouad
*Assistant Examiner* — Khristopher Yodichkas
(74) *Attorney, Agent, or Firm* — Slayden Grubert Beard PLLC

(57) ABSTRACT

A capacitive electrode has a flat electrode with a geometric shape, wherein at least one central portion of the electrode is removed to provide for a frame-like form of the electrode.

12 Claims, 7 Drawing Sheets

CAPACITIVE SENSOR ELECTRODE

TECHNICAL FIELD

The present disclosure relates in general to human interface devices and in particular to capacitive sensor electrodes.

BACKGROUND

Capacitive sensing electrodes are used for many different purposes, for example, to provide for a human interface device. Many different types of keyboard like interfaces, touchscreen interfaces or pen tablet devices have been developed and are in existence. For these type of devices and interfaces, capacitive sensors as shown in FIGS. 1 and 2 are used. These capacitive sensor electrodes as shown, however can only provide for a limited sensitivity. There are a number of different electrode patterns that have been developed and used in the marketplace for Projected Capacitive Touch Sensors. However, there still exists a need exists for an improved capacitive sensor electrode that can provide increased sensitive and also reliability.

SUMMARY

According to an embodiment, a capacitive electrode may have a flat electrode having a geometric shape, wherein at least one central portion of the electrode is removed to provide for a frame-like form of the electrode.

According to a further embodiment, a thickness of the frame may define a capacitive parameter of the electrode. According to a further embodiment, the electrode may comprise a base frame and a plurality of finger frames arranged perpendicular to the base frame and overlapping the base frame. According to a further embodiment, the electrode can be formed by a layer of Indium Tin Oxide (ITO) on plastic film or glass. According to a further embodiment, the electrode can be formed by a layer of electrically conductive material on a substrate.

According to another embodiment, a capacitive sensor structure may comprise a first layer with a plurality of capacitive electrodes arranged in parallel, wherein each electrode comprises a flat electrode having a geometric shape, wherein at least one central portion of the electrode is removed to provide for a frame-like form of the electrode.

According to a further embodiment of the above capacitive sensor, the capacitive sensor structure may further comprise a second layer of electrodes arranged perpendicular to said electrodes of the first layer, wherein first and second layer are insulated by a substrate. According to a further embodiment of the above capacitive sensor, a thickness of the frame may define a capacitive parameter of the electrode. According to a further embodiment of the above capacitive sensor, the electrode may comprise a base frame and a plurality of finger frames arranged perpendicular to the base frame and overlapping the base frame. According to a further embodiment of the above capacitive sensor, the first layer further may comprise connection lines for electrically connecting the electrode. According to a further embodiment of the above capacitive sensor, the base frame and the finger frames can each be rectangular frames. According to a further embodiment of the above capacitive sensor, the base frame and the finger frames may each be rectangular frames. According to a further embodiment of the above capacitive sensor, the connection line may extend through a length of the base frame thereby providing for at least two central portions of the electrode being removed. According to a further embodiment of the above capacitive sensor, the finger frames can overlap the base frame symmetrically. According to a further embodiment of the above capacitive sensor, the finger frames of the most right and the most left electrodes of the first layer may overlap the respective base frame asymmetrically. According to a further embodiment of the above capacitive sensor, finger frames of an electrode can be offset and arranged in inter-digit fashion with respect to finger frames of an adjacent electrode. According to a further embodiment of the above capacitive sensor, finger frames of adjacent electrodes may provide for a mutual capacitances between adjacent electrodes. According to a further embodiment of the above capacitive sensor, the electrode can be formed by a layer of Indium Tin Oxide (ITO) on plastic film or glass. According to a further embodiment of the above capacitive sensor, the electrode can be formed by a layer of electrically conductive material on a substrate.

DETAILED DESCRIPTION

Figure 1:
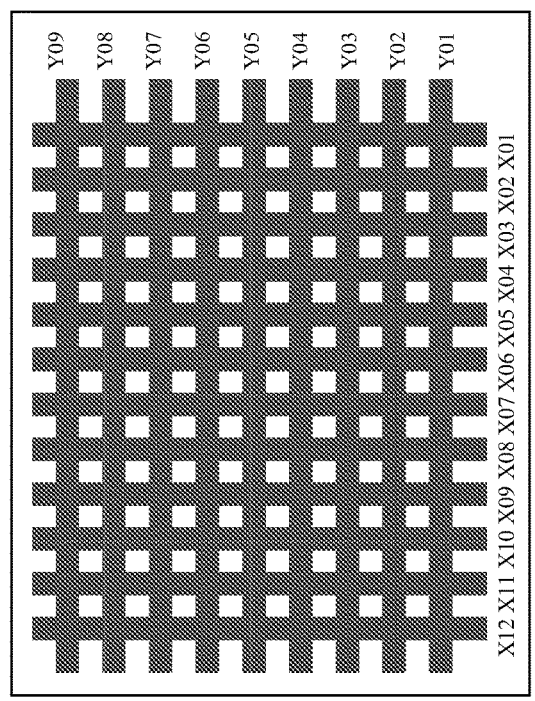
FIG. 1 shows a conventional grid for providing capacitive sensing in a touchscreen pen tablet device.

A projected capacitive touch sensor often consists of, but is not limited to two layers, each having a plurality of conductive electrodes arranged parallel to each other as shown in FIG. 1. The layers are fixed in close proximity to each other and electrically insulated from each other. Transparent materials are used for touchscreen devices whereas pen tablets or track pads do not require such material as they are not necessarily combined with a display. The layers are generally oriented with their electrodes orthogonal to each other. The example in FIG. 1 has the top layer electrodes labeled Y01-Y09 and bottom layer electrodes labeled X01-X12. These electrodes therefore form a grid wherein the primary capacitive couplings are provided at each intersection. As mentioned above, the electrodes are often constructed of, for example, Indium Tin Oxide (ITO) on plastic film or glass for use with display devices.

Figure 2:
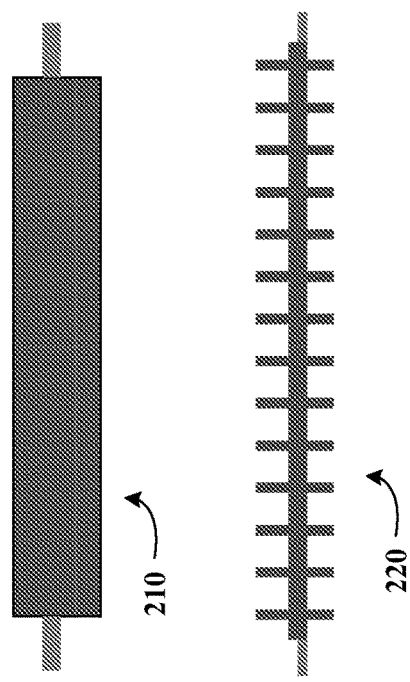
FIG. 2 shows typical variants of capacitive sensor electrodes as used, for example, in a conventional grid.

FIG. 2 shows specific structures as commonly used in such matrix sensor arrangements. Structure 210 is the most basic form similar to the electrodes shown in FIG. 1. Structure 220 differs in providing a plurality of side arms thereby forming a ladder shaped sensor electrode.

Figure 4:
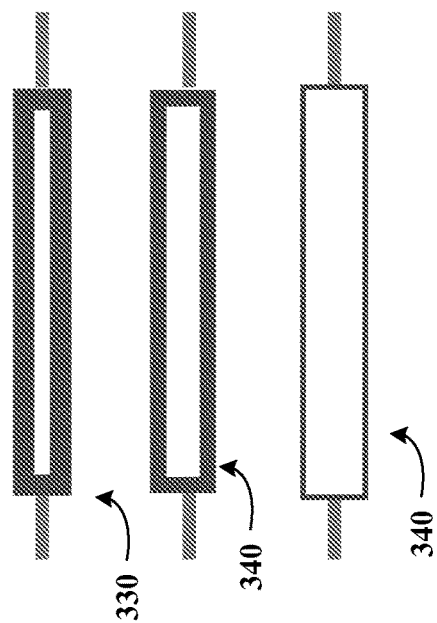
FIG. 4 shows further embodiments of capacitive sensor electrode.
Figure 3:
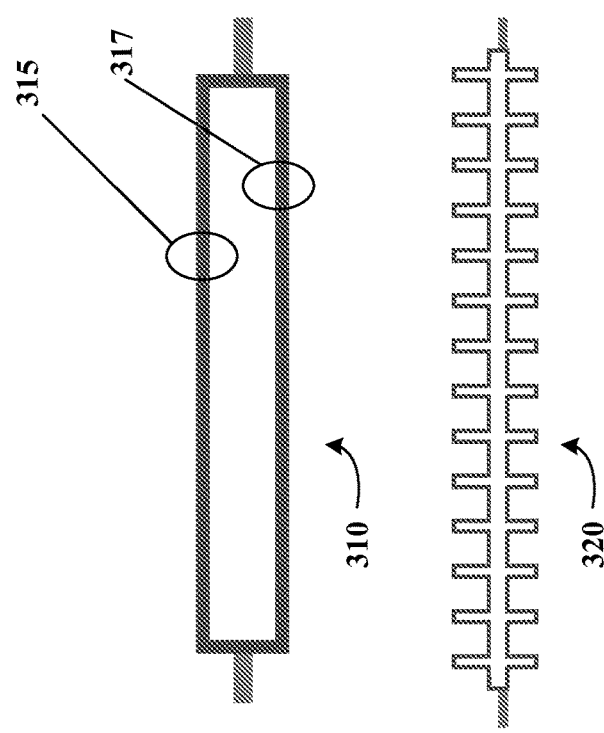
FIG. 3 shows first and second embodiments of an improved capacitive sensor electrode.

FIG. 3 shows embodiments of improved capacitive sensor electrodes according to various embodiments. The concept according to various embodiments is to change from a conventional solid conductor electrode for the sensor's top layer "receivers" to be frame or outline conductors as shown in FIGS. 3 and 4. As shown in FIGS. 3 and 4, these improved capacitive sensor electrodes 310-340 can also be applied to electrodes of different patterns. The frame conductor electrodes according to various embodiments have a number of advantages with respect to manufacturability and yield, electrode capacitance control, improved touch sensitivity.

Manufacturability and Yield

Figure 5:
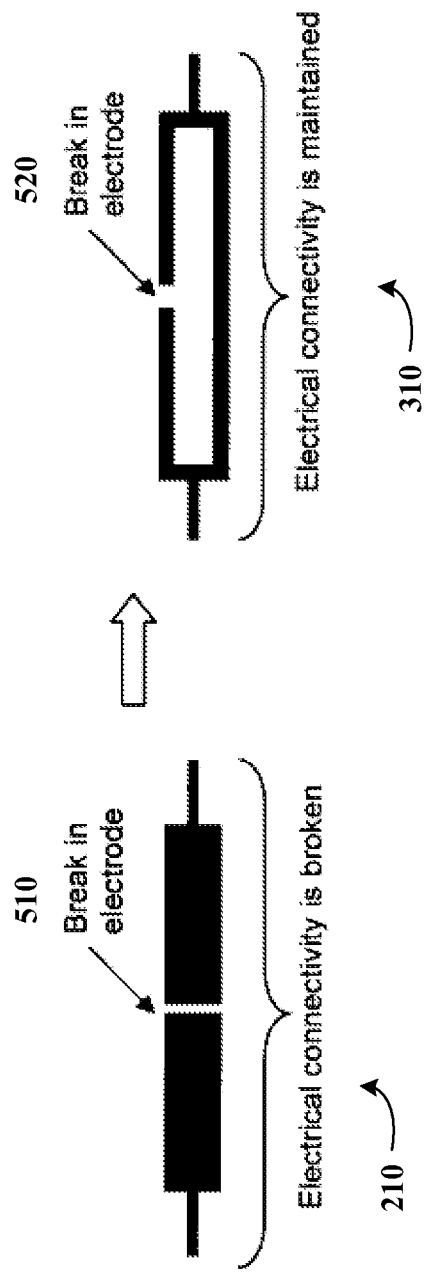
FIG. 5 shows the effect of manufacture defects in a conventional electrode and an electrode according to various embodiments.

It may sometimes be desirable for the electrode width to be near the minimal capability of manufacturing methods. If this is the case, then variations in the manufacturing process may result in some of the electrodes being electrically broken as shown in FIG. 5 with electrode 210 and breaking point 510. The broken electrodes 210 as shown in FIG. 5 cause a functionality problem with an integrated touch product and would therefore normally be scrapped in manufacturing. This decreases the manufacturing yield, which increases the product cost of manufacturing. The frame conductor electrodes 310 according to various embodiments can suffer from a single break 520 and still remain functional as shown in FIG. 5. This presents a manufacturing advantage when the desired electrodes are close to the manufacturing capabilities. The advantage provided by the various embodiments of capacitive sensor electrodes is that it may reduce the manufacturing cost, depending on the desired electrode dimensions and the manufacturing process limitations.

Electrode Capacitance Control

The capacitance of an electrode is partially dependent on the surface area of the conductor. The frame conductor according to various embodiments allows additional design control over the capacitance of the electrodes as shown in FIG. 4 with different frame sizes in electrodes 330, 340 and 340. This is important because certain projected capacitive controllers might realize performance benefits by the receiver electrodes being either lower or higher in capacitance. For a given desired conductor footprint, as shown with electrode embodiments 330, 340, and 350, the width of the loop conductor can be varied by design to alter the capacitance of the overall electrode. The advantage provided by the various embodiments is that it enables some design control over the capacitance of a given electrode footprint.

Improved Touch Sensitivity

Figure 6:
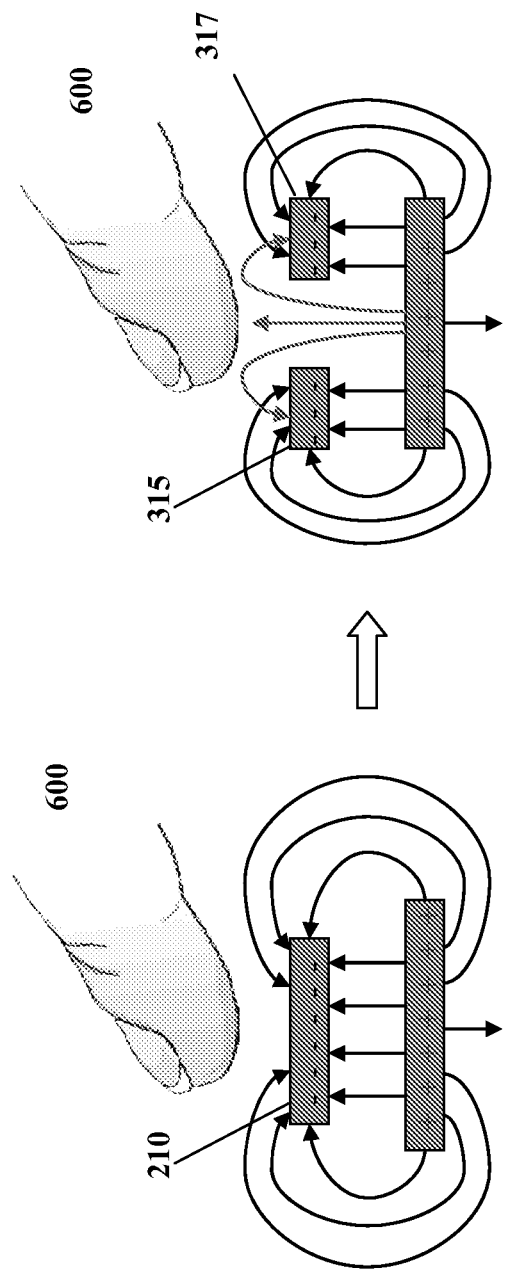
FIG. 6 illustrates the improved sensing properties of a capacitive sensor electrode according to various embodiments.

The loop conductor electrode according to various embodiments as shown for example in FIGS. 3 and 4 alters the shape of the electric field. The frame, for example as shown in the top embodiment of FIG. 3, essentially creates dual electrically common capacitor plates 315, 317 on the sensor's top layer "receivers". FIG. 6 shows the effect provided by the dual capacitor plates resulting in improved touch sensitivity and electric field shaping.

It is desired for a touch to alter the electric field. The effect of the dual plates 315 and 317 as shown in FIG. 6 is to change the electric field characteristics. The standard "filled" electrode 210 shown on the left side of FIG. 6 has two strong regions of fringe field over the two sides of the electrode, which a touch, for example by a finger 600 could alter. The frame electrode 315, 317 provides in contrast for four strong regions of fringe field over the four sided of the dual plates electrode 315, 317, which a touch by a finger 600 could alter. Thus, according to various embodiments, more pronounced top side fringe electric fields are created, which can increase the sensitivity to a touch from above.

Figure 7:
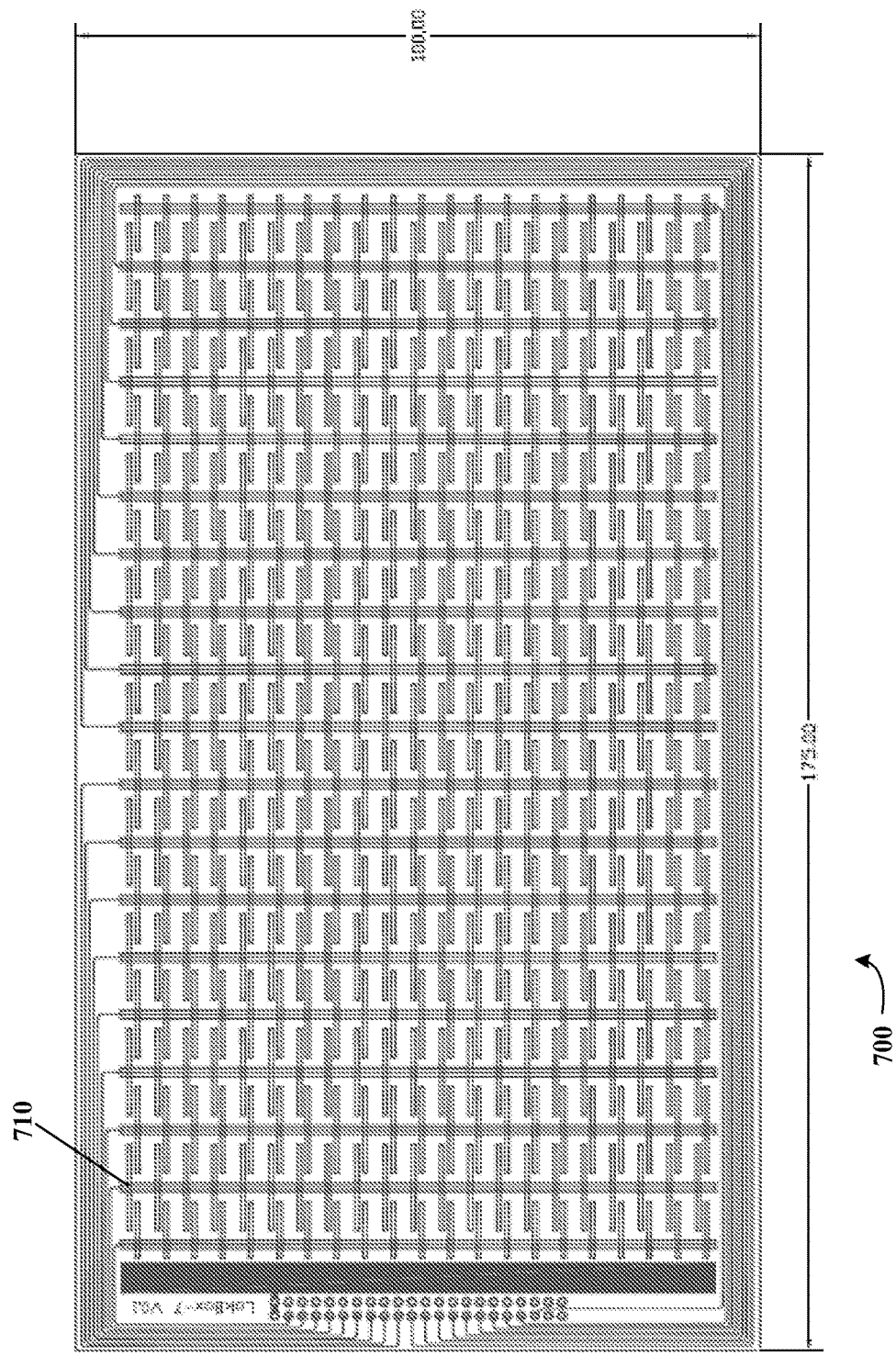
FIG. 7 shows an embodiment of a top sensor structure for use in a touchscreen or tablet device.
Figure 8:
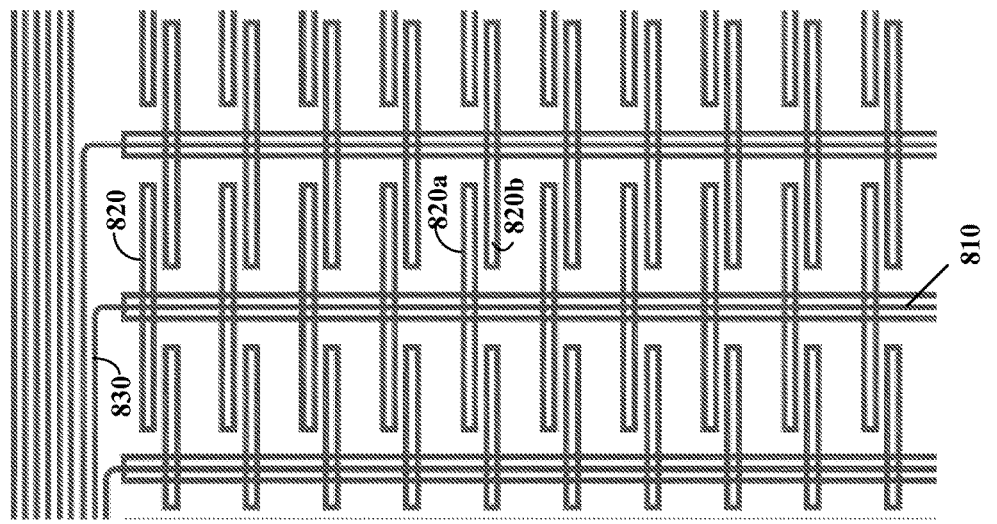
FIG. 8 shows an enlarged section of the structure according to FIG. 7.

FIG. 7 shows an embodiment of a plurality of frame sensor electrodes arranged in vertically parallel for use in a touch sensor device, for example, a top layer electrode structure in a touchscreen or a touch pad device. The structure 700 provides for a plurality of frame sensor electrodes 710 according to various embodiments wherein the most left and right electrodes may be shaped slightly different as shown in FIG. 700. According to an embodiment as shown in more detail in FIG. 8, each frame sensor electrode 710 of the top layer provides for a rectangular framed sensor electrode base 810 and a plurality of rectangular framed side arm or finger electrodes 820 overlapping the base. A connecting line 830 connects an evaluation circuit with the electrode 710. As shown in FIG. 8, the connection line may be extended through the frame of the base 810, thus providing for even more capacitor plates. The framed side arms 820 of each electrode may be slightly offset to the framed side arms of an adjacent electrode and neighboring electrodes may be arranged in an inter-digit fashion as shown in FIGS. 7 and 8. The center electrodes comprise fingers section 820 arranged symmetrically whereas the most left and most right electrodes are shaped asymmetrical with respect to the finger sections 820. The offset arrangement of the frame fingers 820a of one electrode with respect to frame fingers 820b of an adjacent electrode further provides for a mutual capacitance between the neighboring electrodes which also can be alters by a touch.

Figure 9:
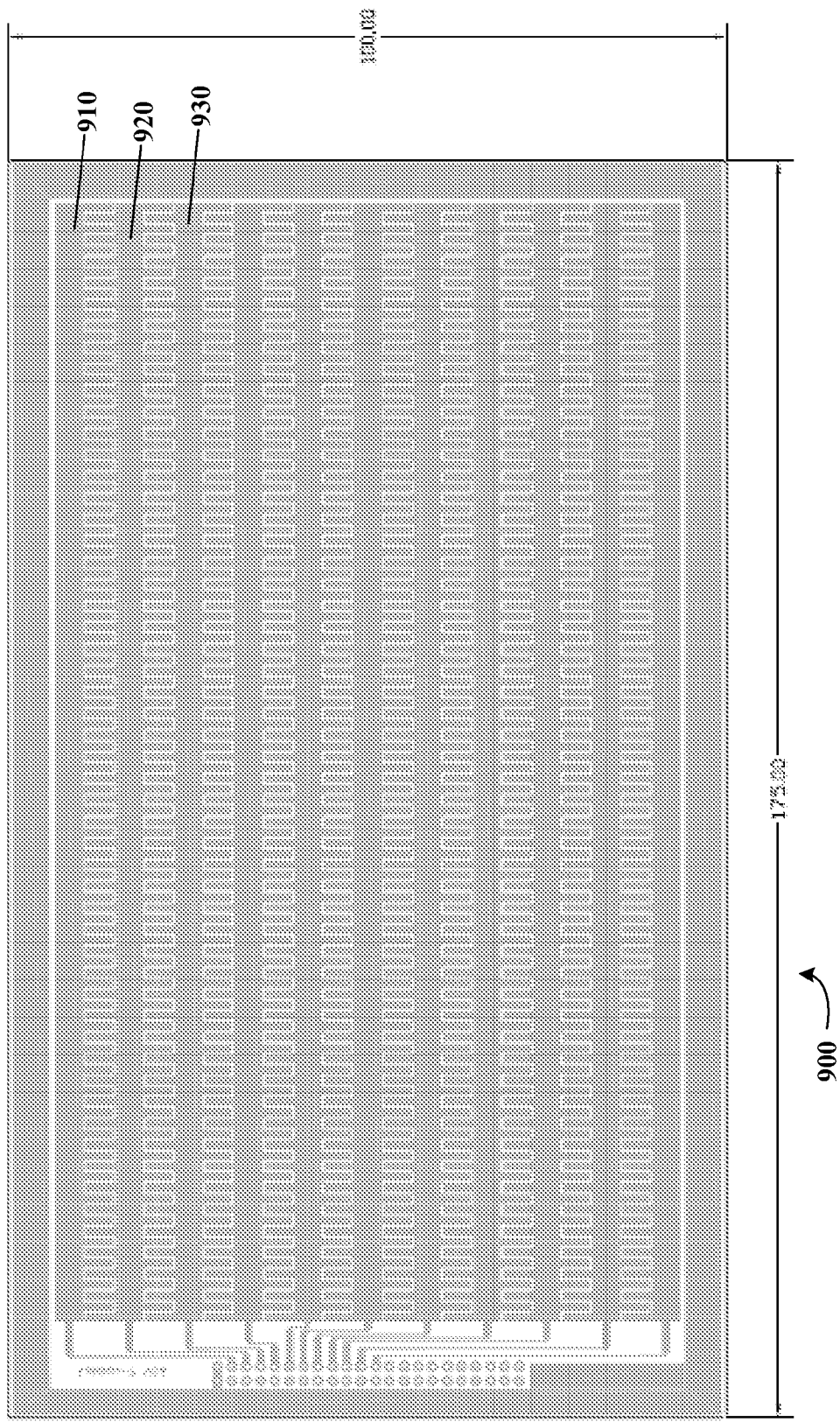
FIG. 9 shows an embodiment of a bottom sensor structure associated with the top sensor structure shown in FIG. 7.

FIG. 9 shows a corresponding bottom electrode structure of the bottom electrodes which here use a conventional electrode formatted and provide for a plurality of horizontally parallel arranged counter electrodes. The top and bottom layer may be separated by glass or a printed circuit board or any other suitable substrate. According to some embodiments, the electrodes of the bottom layer can also be formed similarly to those of the top layer.

Even though the embodiment shown in FIGS. 7-9 can be used for touchscreen sensors or track pad sensors, the electrodes according to various embodiments can be used for other purposes, such as simple touch sensors, sliders or other operating elements. The geometric shapes are not limited to the shown examples. Rather these shapes are mere suggestions for an electrode. Other shapes and forms for electrodes may be used.

What is claimed is:

1. A capacitive sensor structure comprising a sensing area having a width and length, wherein the capacitive sensor structure comprises:
   a plurality of capacitive electrodes, each capacitive electrode comprising:
   a rectangular electrode base section and
   a plurality of rectangular electrode cross sections,
   wherein the entire central portion of the rectangular electrode base section and the entire central portion of each electrode cross section is removed thereby providing for a base frame section and a plurality of cross frame sections,
   wherein the electrode is formed by the base frame section which substantially extends over the width of the sensing area and the plurality of cross frame sections which are symmetrically arranged to cross the rectangular base section and are spaced apart along the width of the sensing area, wherein the plurality of capacitive electrodes are arranged within a first layer and wherein the base sections of the plurality of capacitive electrodes are arranged in parallel; and
   wherein each capacitive electrode is further configured to be connected with a connecting line and wherein the connecting line extends through a center of the base frame section from a top to a bottom of the base frame section along the width of the sensing area.

2. The capacitive sensor structure according to claim 1, comprising a second layer of capacitive electrodes arranged perpendicular to the base frame sections of said capacitive electrodes of the first layer, wherein first and second layer are insulated by a substrate.

3. The capacitive sensor structure according to claim 2, wherein center electrodes of the second layer capacitive electrodes comprise a rectangular base section substantially extending from a left to a right side along a length of the sensing area and a plurality of finger sections from a top and bottom side of the rectangular base section.

4. The capacitive sensor structure according to claim 2, wherein top and bottom electrode of the second layer capacitive electrodes comprise a rectangular base section substantially extending from the left to the right side along the length of the sensing area and a plurality of finger sections from a top or bottom side of the rectangular base section, respectively.

5. The capacitive sensor structure according to claim 3, wherein adjacent capacitive electrodes of the second layer are arranged in an interdigital fashion with respect to the finger sections.

6. A capacitive sensor structure comprising a sensing area having a width and length, wherein the capacitive sensor structure comprises:
   a plurality of capacitive electrodes, each capacitive electrode comprising:
      a rectangular electrode base section and
      a plurality of rectangular electrode cross sections,
      wherein the entire central portion of the rectangular electrode base section and the entire central portion of each electrode cross section is removed thereby providing for a base frame section and a plurality of cross frame sections,
      wherein the electrode is formed by the base frame section which substantially extends over the width of the sensing area and the plurality of cross frame sections which are symmetrically arranged to cross the rectangular base section and are spaced apart along the width of the sensing area, wherein the plurality of capacitive electrodes are arranged within a first layer and wherein the base sections of the plurality of capacitive electrodes are arranged in parallel; and
   wherein the cross frame sections of adjacent capacitive electrodes are offset with respect to the width of the sensing area and adjacent capacitive electrodes are arranged in inter-digital fashion with respect to the cross frame sections,
   wherein each capacitive electrode is further configured to be connected with a connecting line and wherein the connecting line extends through a center of the base frame section from a top to a bottom of the base frame section along the width of the sensing area.

7. The capacitive sensor structure according to claim 6, wherein cross frame sections of adjacent capacitive electrodes provide for a mutual capacitance between adjacent capacitive electrodes.

8. The capacitive sensor structure according to claim 1, wherein each capacitive electrode is formed by a layer of Indium Tin Oxide (ITO) on plastic film or glass.

9. The capacitive sensor structure according to claim 1, wherein each capacitive electrode is formed by a layer of electrically conductive material on a substrate.

10. The capacitive sensor structure according to claim 1, wherein a thickness of a frame defines a capacitive parameter of each capacitive electrode, the frame comprising the base frame section and the plurality of cross frame sections.

11. A capacitive sensor structure comprising a sensing area having a width and length, wherein the capacitive sensor structure comprises a first plurality of capacitive electrodes, each capacitive electrode of the first plurality of capacitive electrodes comprising a rectangular electrode base section and a plurality of rectangular electrode cross sections, wherein the entire central portion of the rectangular electrode base section and the entire central portion of each electrode cross section is removed thereby providing for a base frame section and a plurality of cross frame sections, wherein the electrode is formed by the base frame section which substantially extends over the width of the sensing area and the plurality of cross frame sections which are symmetrically arranged to cross the rectangular base section and are spaced apart along the width of the sensing area,
   wherein the first plurality of capacitive electrodes are arranged within a first layer and wherein the base sections of the first plurality of capacitive electrodes are arranged in parallel,
   further comprising a second layer of electrodes arranged perpendicular to the base frame sections of said capacitive electrodes of the first layer, wherein first and second layer are insulated by a substrate,
   wherein center electrodes of the second layer electrodes comprise a rectangular base section substantially extending from a left to a right side along a length of the sensing area and a plurality of finger sections from a top and bottom side of the rectangular base section,
   wherein top and bottom electrode of the second layer electrodes comprise a rectangular base section substantially extending from the left to the right side along the length of the sensing area and a plurality of finger sections from a top or bottom side, respectively, and
   wherein adjacent electrodes of the second layer are arranged in an interdigital fashion with respect to the finger sections of the second layer electrodes, and
   wherein each capacitive electrode is further configured to be connected with a connecting line and wherein the connecting line extends through a center of the base frame section from a top to a bottom of the base frame section along the width of the sensing area.

12. The capacitive sensor structure of claim 1, further comprising a most right and a most left electrode within the first layer each comprising an electrode base frame section and a plurality of cross frame sections, wherein the plurality of cross frame sections cross the respective base frame asymmetrically.

* * * * *